US012314076B2

(12) United States Patent
Gould et al.

(10) Patent No.: US 12,314,076 B2
(45) Date of Patent: *May 27, 2025

(54) FAST PREDICTION PROCESSOR

(71) Applicant: Lightmatter, Inc., Boston, MA (US)

(72) Inventors: Michael Gould, La Honda, CA (US); Carl Ramey, Westborough, MA (US); Nicholas C. Harris, Menlo Park, CA (US); Darius Bunandar, Boston, MA (US)

(73) Assignee: Lightmatter, Inc., Boston, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/675,736

(22) Filed: May 28, 2024

(65) Prior Publication Data

US 2024/0310867 A1    Sep. 19, 2024

Related U.S. Application Data

(63) Continuation of application No. 17/359,025, filed on Jun. 25, 2021, now Pat. No. 12,038,777.

(Continued)

(51) Int. Cl.
*G06E 3/00* (2006.01)
*H03H 17/00* (2006.01)
(Continued)

(52) U.S. Cl.
CPC .............. *G06E 3/008* (2013.01); *H03H 17/06* (2013.01); *H03H 2017/0081* (2013.01); *H03M 1/12* (2013.01)

(58) Field of Classification Search
CPC .... G06E 3/00–008; H03H 17/00–0036; H03H 17/02–0202; H03H 17/06; H03H 2017/0072–009; H03H 2017/0204–021; H03H 2017/0244; H03H 2017/0245; H03H 2218/10; H03H 2021/0092;
(Continued)

(56) References Cited

U.S. PATENT DOCUMENTS

2003/0043133 A1    6/2003 Tzelnick
2011/0249709 A1*  10/2011 Shiue ................ H04L 27/26532
                                                      375/298

(Continued)

OTHER PUBLICATIONS

Extended European Search Report dated Aug. 9, 2024, in connection with European Application No. EP 21831732.9.

*Primary Examiner* — Emily E Larocque
(74) *Attorney, Agent, or Firm* — Wolf, Greenfield & Sacks, P.C.

(57) ABSTRACT

Hybrid analog-digital processing systems are described. An example of a hybrid analog-digital processing system includes photonic accelerator configured to perform matrix-vector multiplication using light. The photonic accelerator exhibits a frequency response having a first bandwidth (e.g., less than 3 GHz). The hybrid analog-digital processing system further includes a plurality of analog-to-digital converters (ADCs) coupled to the photonic accelerator, and a plurality of digital equalizers coupled to the plurality of ADCs, wherein the digital equalizers are configured to set a frequency response of the hybrid analog-digital processing system to a second bandwidth greater than the first bandwidth.

21 Claims, 8 Drawing Sheets

Related U.S. Application Data

(60) Provisional application No. 63/045,772, filed on Jun. 29, 2020.

(51) Int. Cl.
*H03H 17/06* (2006.01)
*H03M 1/12* (2006.01)

(58) Field of Classification Search
CPC .. H03H 2021/0094; H03H 2021/0096; H03M 1/12; H03M 1/66; H04B 10/6971; H04B 10/294; H04B 10/2941; H04B 10/25043
See application file for complete search history.

(56) References Cited

U.S. PATENT DOCUMENTS

| | | |
|---|---|---|
| 2013/0024741 A1 | 1/2013 | Li |
| 2015/0303934 A1 | 10/2015 | Chiu et al. |
| 2019/0370652 A1 | 12/2019 | Shen et al. |

\* cited by examiner

FAST PREDICTION PROCESSOR

CROSS-REFERENCE TO RELATED APPLICATION

This application is a continuation claiming the benefit under 35 U.S.C. § 120 of U.S. patent application Ser. No. 17/359,025, filed Jun. 25, 2021, and entitled "FAST PREDICTION PROCESSOR," which claims the benefit under 35 U.S.C. § 119(e) of U.S. Provisional Patent Application Ser. No. 63/045,772, entitled "FAST PREDICTION PROCESSOR," filed on Jun. 29, 2020, each of which is hereby incorporated herein by reference in its entirety.

BACKGROUND

Deep learning, machine learning, latent-variable models, neural networks, and other matrix-based differentiable programs are used to solve a variety of problems, including natural language processing and object recognition in images. Solving these problems with deep neural networks typically requires long processing times to perform the required computation. The most computationally intensive operations in solving these problems are often mathematical matrix operations, such as matrix multiplication.

SUMMARY OF THE DISCLOSURE

In an embodiment, a hybrid analog-digital processing system includes:
  a photonic accelerator configured to perform matrix-vector multiplication using light, wherein the photonic accelerator exhibits a frequency response having a first bandwidth;
  a plurality of analog-to-digital converters (ADCs) coupled to the photonic accelerator; and
  a plurality of digital equalizers coupled to the plurality of ADCs, wherein the digital equalizers are configured to set a frequency response of the hybrid analog-digital processing system to a second bandwidth greater than the first bandwidth.

In an embodiment, a method for performing a mathematical operation using a hybrid analog-digital processing system comprising a photonic accelerator, includes:
  obtaining a plurality of parameters representing a first matrix;
  obtaining a first plurality of inputs representing a first input vector and obtaining a second plurality of inputs representing a second input vector;
  at a first time, generating a first output vector by performing matrix-vector multiplication using the photonic accelerator based at least in part on the plurality of parameters and the first plurality of inputs;
  at a second time subsequent to the first time, generating a second output vector by performing matrix-vector multiplication using the photonic accelerator based at least in part on the second plurality of inputs; and
  generating an equalized output vector by combining the first output vector with the second output vector.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in the figures in which they appear.

DETAILED DESCRIPTION

I. Overview

Figure 1A:
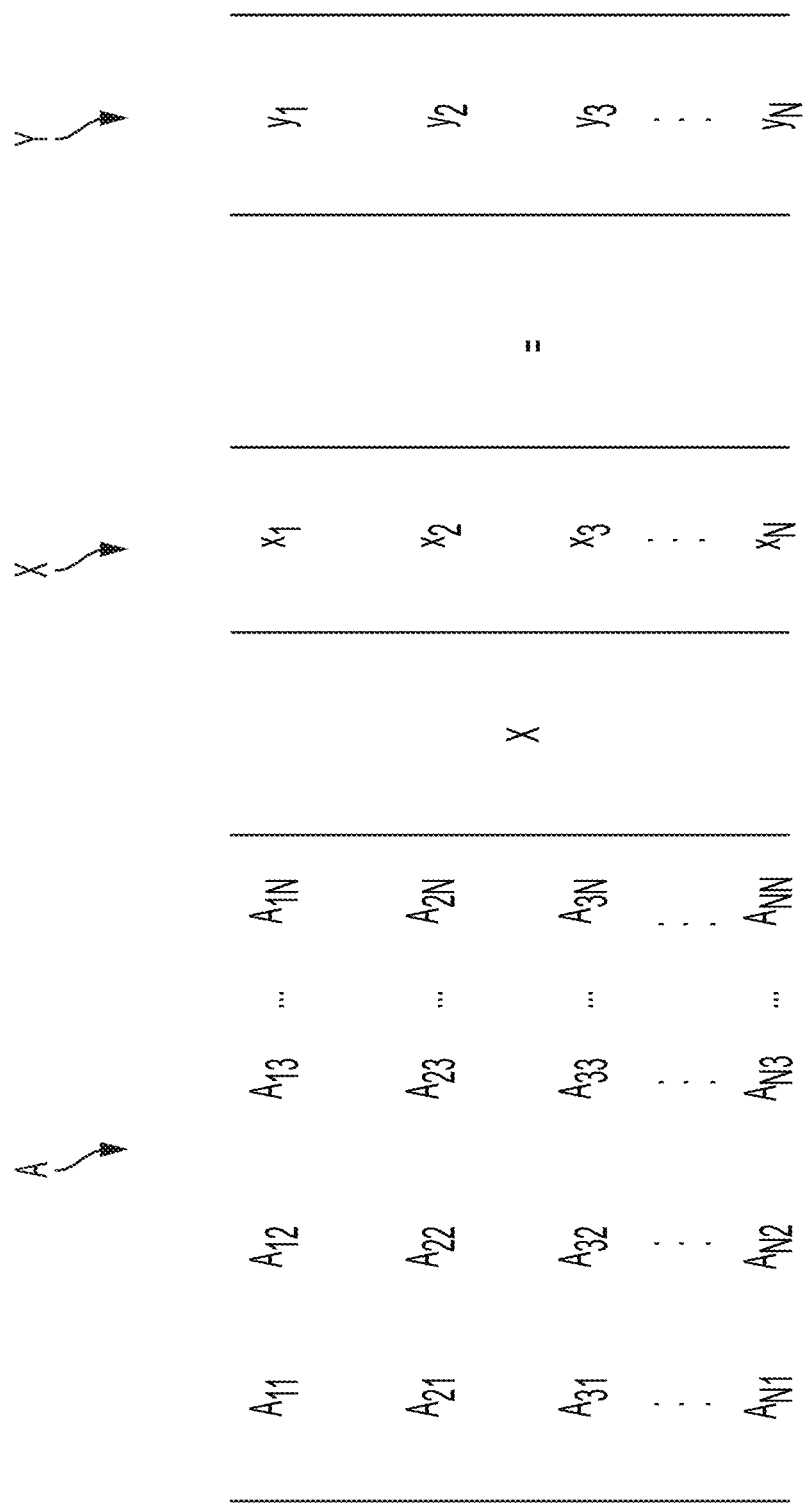
FIG. 1A illustrates a representative matrix-vector multiplication, in accordance with some embodiments.

The inventors have recognized and appreciated that conventional computing systems are not sufficiently fast to keep up with the ever increasing demand for data throughput in modern applications. Conventional electronic processors face severe speed and efficiency limitations primarily due to the inherent presence of parasitic capacitance in electrical interconnects. Every wire and transistor in the circuits of an electrical processor has a resistance, an inductance, and a capacitance that cause propagation delay and power dissipation in any electrical signal. For example, connecting multiple processor cores and/or connecting a processor core to a memory uses a conductive trace with a non-zero impedance. Large values of impedance limit the maximum rate at which data can be transferred through the trace with a negligible bit error rate. Most conventional processors cannot support clock frequencies in excess of 2-3 GHz.

In applications where time delay is crucial, such as high frequency stock trading, even a delay of a few hundredths of a second can make an algorithm unfeasible for use. For processing that requires billions of operations by billions of transistors, these delays add up to a significant loss of time. In addition to electrical circuits' inefficiencies in speed, the heat generated by the dissipation of energy caused by the impedance of the circuits is also a barrier in developing electrical processors.

In digital computers, the output of a calculation has to completely settle to its final one/zero value prior to being sampled. Otherwise, sampling the output of a calculation before it settles may lead to errors. Typically, a sample is taken once the output of a calculation has gone beyond the linear switching threshold of a transistor, and the next calculation is not started until the previous calculation has completely settled and has been sampled. This limits the throughput in digital computers.

By contrast, analog computers do not operate in the saturated region of the transistors. Instead, analog computers operate on the basis of a continuum of values. Such values must be resolved to a defined level of precision over a certain window of time. Certain analog computers are designed to operate in concert with digital systems (e.g., digital memories and processors). These systems are called hybrid analog-digital computers. A digital system discretizes the output of an analog computer to a total $2^b$ levels, where b is the bit precision of the output. Analog computers are also characterized by a finite bandwidth due to the presence of parasitic capacitance, similar to digital processors. The finite bandwidth increases the time necessary for the output of an analog computer to settle to the desired discretized level. Analog computers having a single-pole response, for example, are characterized by time constant $\tau$, which sets the time scale at which the output signal rises and falls. Typically, the e-folding time (the time necessary for the signal to rise or fall by a factor of e) is used to define this time constant $\tau$. In such systems, it may take multiples of $\tau$ before the signal settles to a value precise to the desired discretization level of $1/2^b$. Performance of such a system is limited if the subsequent calculation is not started until the previous calculation has settled to a level of $1/2^b$ of the final value. However, if a new calculation is begun too soon, interference between the two overlapping calculations arises, which could result in the sampling of wrong output (an effect referred to herein as "inter-calculation-interference").

Thus, conventional computers, whether digital or analog in nature, suffer from limited throughput.

The inventors have developed techniques to improve the data throughput of hybrid analog-digital computing systems. The techniques developed by the inventors and described herein involve launching a new set of operands before the previous set of operands has settled to a level of $1/2^b$ of the final value. This can be accomplished in some embodiments using digital equalization. Digital equalization involves inverting the channel characteristic of an analog processor in such a way that the received signal settles more quickly, thereby allowing for disambiguation of inter-calculation-interference. Digital equalization may be performed on the transmitter side of the calculation, one the receiver side of the calculation (or both). Several types of digital equalization techniques may be used, including but not limited to pre-emphasis, continuous time linear equalization (CTLE) and discrete feedback equalization (DFE). Processors leveraging the digital equalization techniques described herein may be fast enough to support clock frequencies in excess of 10 Ghz, 15 GHz or even 20 GHz, which represents a substantial improvement over conventional processors.

II. Photonic Hybrid Processors

The inventors have recognized and appreciated that using optical signals (instead of, or in combination with, electrical signals) overcomes some of the problems with electronic computing. Optical signals travel at the speed of light in the medium in which the light is traveling. Thus, the latency of optical signals is far less of a limitation than electrical propagation delay. Additionally, no power is dissipated by increasing the distance traveled by the light signals, opening up new topologies and processor layouts that would not be feasible using electrical signals. Thus, photonic processors offer far better speed and efficiency performance than conventional electronic processors.

Some embodiments relate to photonic processors designed to perform machine learning algorithms or other types of data-intensive computations. Certain machine learning algorithms (e.g., support vector machines, artificial neural networks and probabilistic graphical model learning) rely heavily on linear transformations on multi-dimensional arrays/tensors. The simplest linear transformation is a matrix-vector multiplication, which using conventional algorithms has a complexity on the order of $O(N^2)$, where N is the dimensionality of a square matrix being multiplied by a vector of the same dimension. General matrix-matrix (GEMM) operations are ubiquitous in software algorithms, including those for graphics processing, artificial intelligence, neural networks and deep learning. GEMM calculations in today's computers are typically performed using transistor-based systems such as GPUs or systolic array systems.

FIG. 1A is a representation of a matrix-vector multiplication, in accordance with some embodiments. Matrix A is referred to herein as "input matrix" or simply "matrix," and the individual elements of matrix A are referred to herein as "matrix values" or "matrix parameters." Vector X is referred to herein as "input vector," and the individual elements of vector X are referred to as "input value," or simply "inputs." Vector Y is referred to herein as "output vector," and the individual elements of vector Y are referred to as "output values," or simply "outputs." In this example, A is an N×N matrix, though embodiments of the present application are not limited to square matrices or to any specific dimension. In the context of artificial neural networks, matrix A can be a weight matrix, or a block of submatrix of the weight tensor, or an activation (batched) matrix, or a block of submatrix of the (batched) activation tensor, among several possible examples. Similarly, the input vector X can be a vector of the weight tensor or a vector of the activation tensor, for example.

The matrix-vector multiplication of FIG. 1A can be decomposed in terms of scalar multiplications and scalar additions. For example, an output value $y_i$ (where i=1, 2 ... N) can be computed as a linear combination of the input values $x_1, X_2 ... x_N$. Obtaining $y_i$ involves performing scalar multiplications (e.g., $A_{i1}$ times $x_1$, and $A_{i2}$ times $x_2$) and scalar additions (e.g., $A_{i1}x_1$ plus $A_{i2}x_2$). In some embodiments, scalar multiplications, scalar additions, or both, may be performed in the optical domain.

Figure 1B:
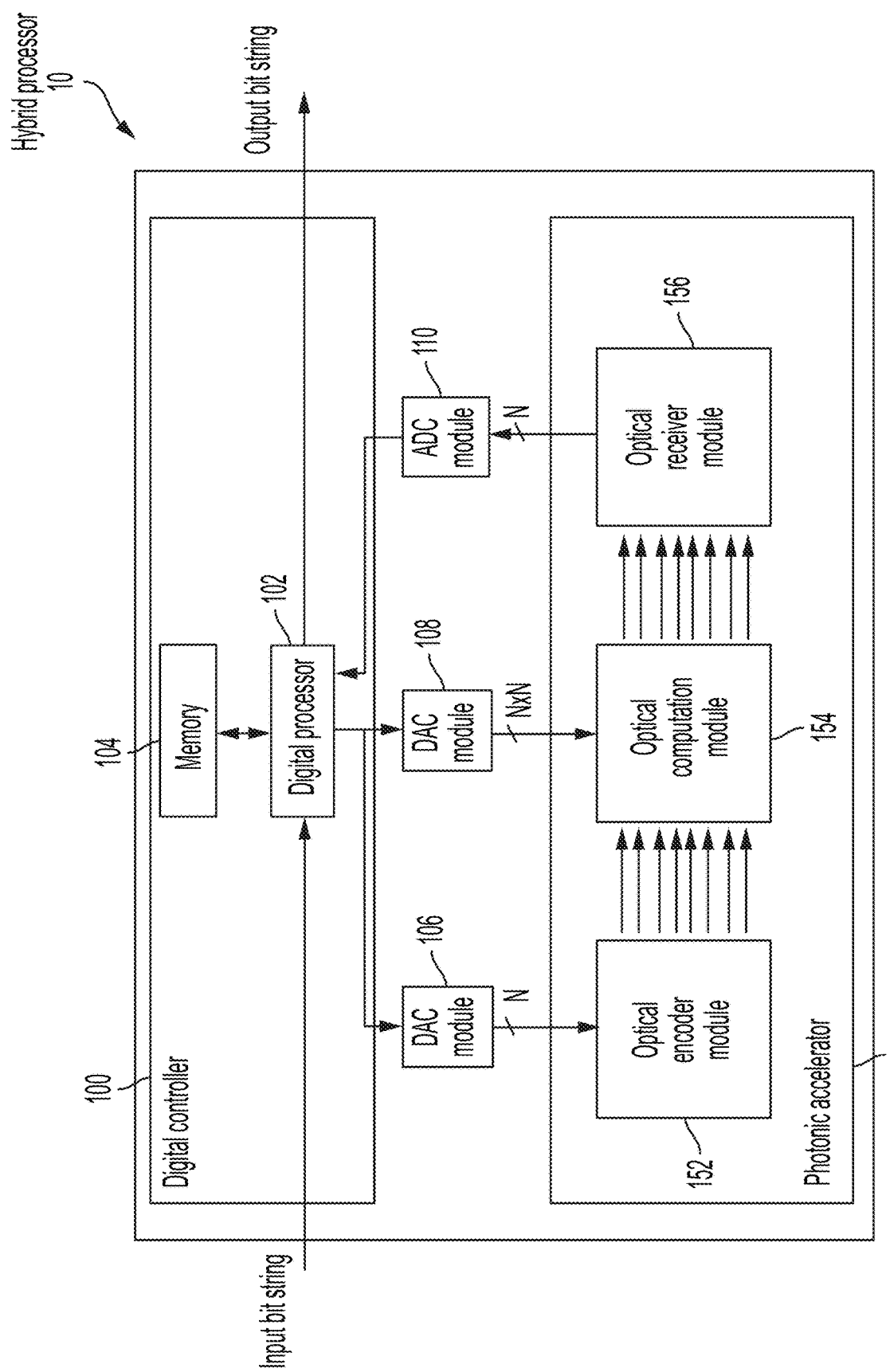
FIG. 1B is a block diagram illustrating a hybrid analog-digital processor configured to perform matrix-vector multiplication, in accordance with some embodiments.

FIG. 1B illustrates a hybrid analog-digital processor 10 implemented using photonic circuits, in accordance with some embodiments. Hybrid processor 10 may be configured to perform matrix-vector multiplications (of the types illustrated in FIG. 1A, for example). Hybrid processor 10 includes a digital controller 100 and a photonic accelerator 150. Digital controller 100 operates in the digital domain and photonic accelerator 150 operates in the analog photonic domain. Digital controller 100 includes a digital processor 102 a memory 104. Photonic accelerator 150 includes an optical encoder module 152, an optical computation module 154 and an optical receiver module 156. Digital-to-analog (DAC) modules 106 and 108 convert digital data to analog signals. Analog-to-digital (ADC) module 110 converts analog signals to digital values. Thus, the DAC/ADC modules provide an interface between the digital domain and the analog domain. In this example, DAC module 106 produces N analog signals (one for each entry of an input vector), DAC module 108 produces N×N analog signals (one for each entry of a matrix), and ADC module 110 receives N analog signals (one for each entry of an output vector). Although matrix A is square in this example, it may be rectangular in some embodiments, such that the size of the output vector differs from the size of the input vector.

Hybrid processor 10 receives, as an input from an external processor (e.g., a CPU), an input vector represented by a group of input bit strings and produces an output vector represented by a group of output bit strings. For example, if the input vector is an N-dimensional vector, the input vector may be represented by N separate bit strings, each bit string representing a respective component of the vector. The input bit string may be received as an electrical signal from the external processor and the output bit string may be transmitted as an electrical signal to the external processor. In some embodiments, digital processor 102 does not necessarily output an output bit string after every process iteration. Instead, the digital processor 102 may use one or more output bit strings to determine a new input bit stream to feed through the components of the hybrid processor 10. In some embodiments, the output bit string itself may be used as the input bit string for a subsequent iteration of the process implemented by the hybrid processor 10. In other embodiments, multiple output bit streams are combined in various ways to determine a subsequent input bit string. For example, one or more output bit strings may be summed together as part of the determination of the subsequent input bit string.

DAC module 106 is configured to convert the input bit strings into analog signals. The optical encoder module 152 is configured to convert the analog signals into optically encoded information to be processed by the optical computation module 154. The information may be encoded in the amplitude, phase and/or frequency of an optical pulse. Accordingly, optical encoder module 152 may include optical amplitude modulators, optical phase modulators and/or optical frequency modulators. In some embodiments, the optical signal represents the value and sign of the associated bit string as an amplitude and a phase of an optical pulse. In some embodiments, the phase may be limited to a binary choice of either a zero phase shift or a x phase shift, representing a positive and negative value, respectively. Embodiments are not limited to real input vector values. Complex vector components may be represented by, for example, using more than two phase values when encoding the optical signal.

The optical encoder module 152 outputs N separate optical pulses that are transmitted to the optical computation module 154. Each output of the optical encoder module 152 is coupled one-to-one to an input of the optical computation module 154. In some embodiments, the optical encoder module 152 may be disposed on the same substrate as the optical computation module 154 (e.g., the optical encoder module 152 and the optical computation module 154 are on the same chip). In such embodiments, the optical signals may be transmitted from the optical encoder module 152 to the optical computation module 154 in waveguides, such as silicon photonic waveguides. In other embodiments, the optical encoder module 152 may be disposed on a separate substrate from the optical computation module 154. In such embodiments, the optical signals may be transmitted from the optical encoder module 152 to optical computation module 154 with optical fibers.

The optical computation module 154 performs the multiplication of an input vector X by a matrix A. In some embodiments, optical computation module 154 includes multiple optical multipliers each configured to perform a scalar multiplication between an entry of the input vector and an entry of matrix A in the optical domain. Optionally, optical computation module 154 may further include optical adders for adding the results of the scalar multiplications to one another in the optical domain. Alternatively, the additions may be performed in electrically. For example, optical receiver module 156 may produce a voltage resulting from the integration (over time) of a photocurrent received from a photodetector.

The optical computation module 154 outputs N separate optical pulses that are transmitted to the optical receiver module 156. Each output of the optical computation module 154 is coupled one-to-one to an input of the optical receiver module 156. In some embodiments, the optical computation module 154 may be disposed on the same substrate as the optical receiver module 156 (e.g., the optical computation module 154 and the optical receiver module 156 are on the same chip). In such embodiments, the optical signals may be transmitted from the optical computation module 154 to the optical receiver module 156 in silicon photonic waveguides. In other embodiments, the optical computation module 154 may be disposed on a separate substrate from the optical receiver module 156. In such embodiments, the optical signals may be transmitted from the photonic processor 103 to the optical receiver module 156 using optical fibers.

The optical receiver module 156 receives the N optical pulses from the optical computation module 154. Each of the optical pulses is then converted to an electrical analog signal. In some embodiments, the intensity and phase of each of the optical pulses is detected by optical detectors within the optical receiver module. The electrical signals representing those measured values are then converted into the digital domain using ADC module 110, and provided back to the digital processor 102.

The digital processor 102 controls the optical encoder module 152, the optical computation module 154 and the optical receiver module 156. The memory 104 may be used to store input and output bit strings and measurement results from the optical receiver module 156. The memory 104 also stores executable instructions that, when executed by the digital processor 102, control the optical encoder module 152, optical computation module 154 and optical receiver module 156. The memory 104 may also include executable instructions that cause the digital processor 102 to determine a new input vector to send to the optical encoder based on a collection of one or more output vectors determined by the measurement performed by the optical receiver module 156. In this way, the digital processor 102 can control an iterative process by which an input vector is multiplied by multiple matrices by adjusting the settings of the optical computation module 154 and feeding detection information from the optical receiver module 156 back to the optical encoder module 152. Thus, the output vector transmitted by the hybrid processor 10 to the external processor may be the result of multiple matrix multiplications, not simply a single matrix multiplication.

Figure 2:
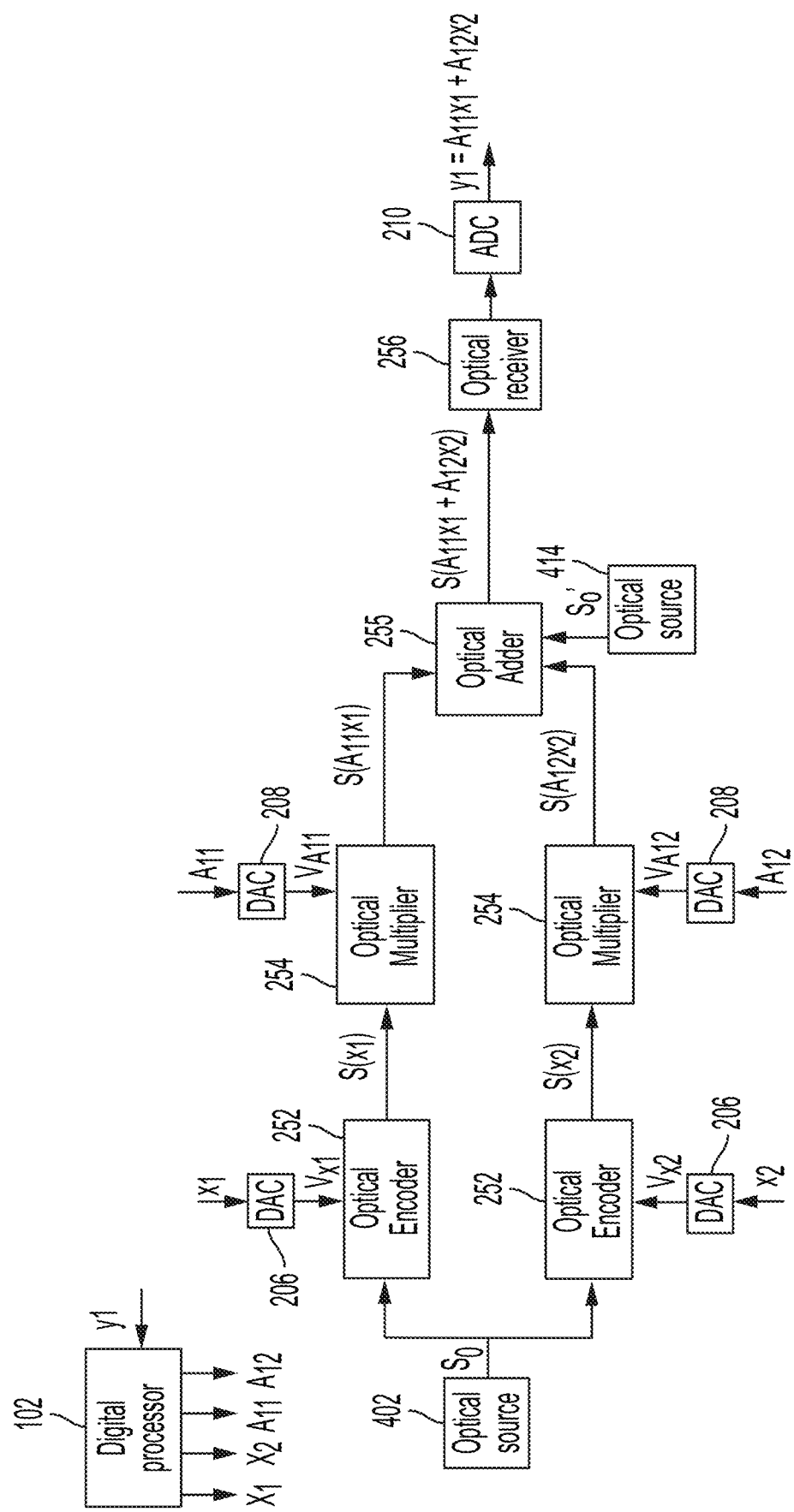
FIG. 2 is a block diagram illustrating a portion of the photonic accelerator of FIG. 1B, in accordance with some embodiments.

FIG. 2 illustrates a portion of photonic accelerator 150 in additional detail, in accordance with some embodiments. More specifically, FIG. 2 illustrates the circuitry for computing $y_1$, the first entry of output vector Y. For simplicity, in this example, the input vector has only two entries, $x_1$ and $x_2$. However, the input vector may have any suitable size.

DAC module 106 includes DACs 206, DAC module 108 includes DACs 208, and ADC module 110 includes ADC 210. DACs 206 produce electrical analog signals (e.g., voltages or currents) based on the value that they receive. For example, voltage $V_{X1}$ represents value $x_1$, voltage $V_{X2}$ represents value $x_2$, voltage $V_{A11}$ represents value $A_{11}$, and voltage $V_{A12}$ represents value $A_{12}$. Optical encoder module 152 includes optical encoders 252, optical computation module 154 includes optical multipliers 154 and optical adder 255, and optical receiver module 156 includes optical receiver 256.

Optical source 402 produces light $S_0$. Optical source 402 may be implemented in any suitable way. For example, optical source 402 may include a laser, such as an edge-emitting laser of a vertical cavity surface emitting laser (VCSEL), examples of which are described in detail further below. In some embodiments, optical source 402 may be configured to produce multiple wavelengths of light, which enables optical processing leveraging wavelength division multiplexing (WDM), as described in detail further below. For example, optical source 402 may include multiple laser cavities, where each cavity is specifically sized to produce a different wavelength.

The optical encoders 252 encode the input vector into a plurality of optical signals. For example, one optical encoder 252 encodes input value $x_1$ into optical signal $S(x_1)$ and another optical encoder 252 encodes input value $x_2$ into optical signal $S(x_2)$. Input values $x_1$ and $x_2$, which are provided by digital processor 102, are digital signed real numbers (e.g., with a floating point or fixed point digital representation). The optical encoders modulate light $S_0$ based on the respective input voltage. For example, optical encoder 404 modulates amplitude, phase and/or frequency of the light to produce optical signal $S(x_1)$ and optical encoder 406 modulates the amplitude, phase and/or frequency of the light to produce optical signal $S(x_2)$. The optical encoders may be implemented using any suitable optical modulator, including for example optical intensity modulators. Examples of such modulators include Mach-Zehnder modulators (MZM), Franz-Keldysh modulators (FKM), resonant modulators (e.g., ring-based or disc-based), nano-electro-electro-mechanical-system (NOEMS) modulators, etc.

The optical multipliers are designed to produce signals indicative of a product between an input value and a matrix value. For example, one optical multiplier 254 produces a signal $S(A_{11}x_1)$ that is indicative of the product between input value $x_1$ and matrix value $A_{11}$ and another optical multiplier 254 produces a signal $S(A_{12}x_2)$ that is indicative of the product between input value $x_2$ and matrix value $A_{12}$. Examples of optical multipliers include Mach-Zehnder modulators (MZM), Franz-Keldysh modulators (FKM), resonant modulators (e.g., ring-based or disc-based), nano-electro-electro-mechanical-system (NOEMS) modulators, etc. In one example, an optical multiplier may be implemented using a modulatable detector. Modulatable detectors are photodetectors having a characteristic that can be modulated using an input voltage. For example, a modulatable detector may be a photodetector with a responsivity that can be modulated using an input voltage. In this example, the input voltage (e.g., $V_{A11}$) sets the responsivity of the photodetector. The result is that the output of a modulatable detector depends not only on the amplitude of the input optical signal but also on the input voltage. If the modulatable detector is operated in its linear region, the output of a modulatable detector depends on the product of the amplitude of the input optical signal and the input voltage (thereby achieving the desired multiplication function).

Optical adder 412 receives electronic analog signals $S(A_{11}x_1)$ and $S(A_{12}x_2)$ and light $S_0'$ (generated by optical source 414), and produces an optical signal $S(A_{11}x_1+A_{12}x_2)$ that is indicative of the sum of $A_{11}x_1$ with $A_{12}x_2$.

Optical receiver 256 generates an electronic digital signal indicative of the sum $A_{11}x_1+A_{12}x_2$ based on the optical signal $S(A_{11}x_1+A_{12}x_2)$. In some embodiments, optical receiver 256 includes a coherent detector and a transimpedance amplifier. The coherent detector produces an output that is indicative of the phase difference between the waveguides of an interferometer. Because the phase difference is a function of the sum $A_{11}x_1+A_{12}x_2$, the output of the coherent detector is also indicative of that sum. The ADC converts the output of the coherent receiver to output value $y_1=A_{11}x_1+A_{12}x_2$. Output value $y_1$ may be provided as input back to digital processor 102, which may use the output value for further processing.

III. Digital Equalization

The inventors have recognized and appreciated that hybrid light-based processors of the types described in the previous section, despite being substantially faster than conventional fully digital processors, suffer from limited bandwidth. Hybrid light-based processors of the types described herein are faster than fully digital processors because some of the conductive traces are replaced by optical waveguides, and optical waveguides do not suffer from parasitic capacitance. Nonetheless, these hybrid light-based processors still include some conductive traces for supporting electrical signals that control the operations of the photonic processors. Such conductive traces, unfortunately, exhibit parasitic capacitance. The longer the conductive traces, the larger the parasitic capacitance and the lower the bandwidth of the hybrid light-based processor. For example, an electrical path that is 1 cm or longer may limit the bandwidth of the processor to less than 3 GHz. FIG. 3A illustrates a representative amplitude response of a hybrid processor as a function of frequency. In this example, the hybrid processor exhibits a single-pole response with a bandwidth between 2 GHZ and 3 GHZ.

Figure 3B:
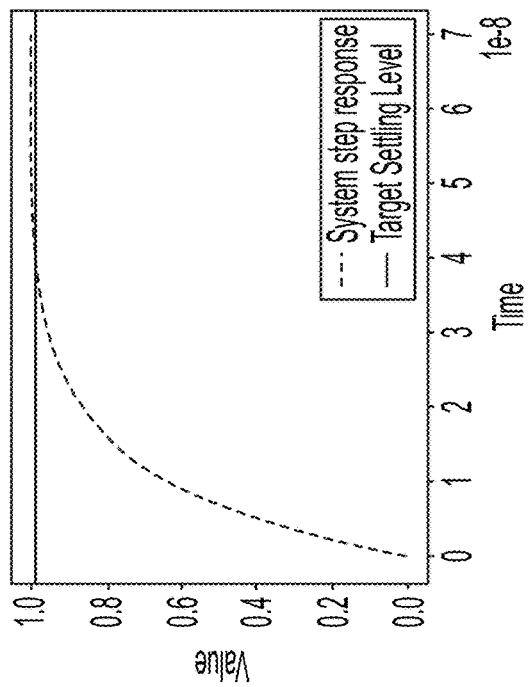
FIGS. 3B-3C are plots illustrating representative time-domain responses of a photonic accelerator, in accordance with some embodiments.

The effect of having such a response is illustrated in FIG. 3B, which illustrates the time-domain response of a hybrid processor, in accordance with some embodiments. This plot illustrates the target settling level (the final desired level) and the processor's actual response as a function of time. The processor's limited bandwidth results in the response taking several nanoseconds before reaching the desired level. The characteristic time constant τ, which is inversely proportional to the processor's bandwidth, sets the rate at which the output signal rises and falls. Typically, the e-folding time (the time for the signal to rise or fall by a factor of e) is used to define this time constant τ. In such systems, it may take multiples of τ before the signal settles to a value precise to the desired discretization level of $1/2^b$ (where b represents the bit precision). Performance of such a system is limited if the subsequent calculation is not started until the previous calculation has settled to a level of $1/2^b$ of the final value. However, if a new calculation is begun too soon, interference between the two overlapping calculations arises, which could result in inter-calculation-interference.

Figure 3C:
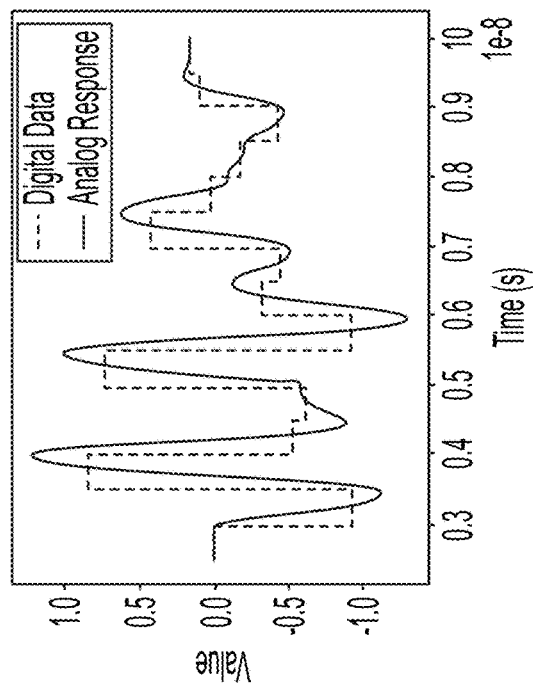
Figure 3A:
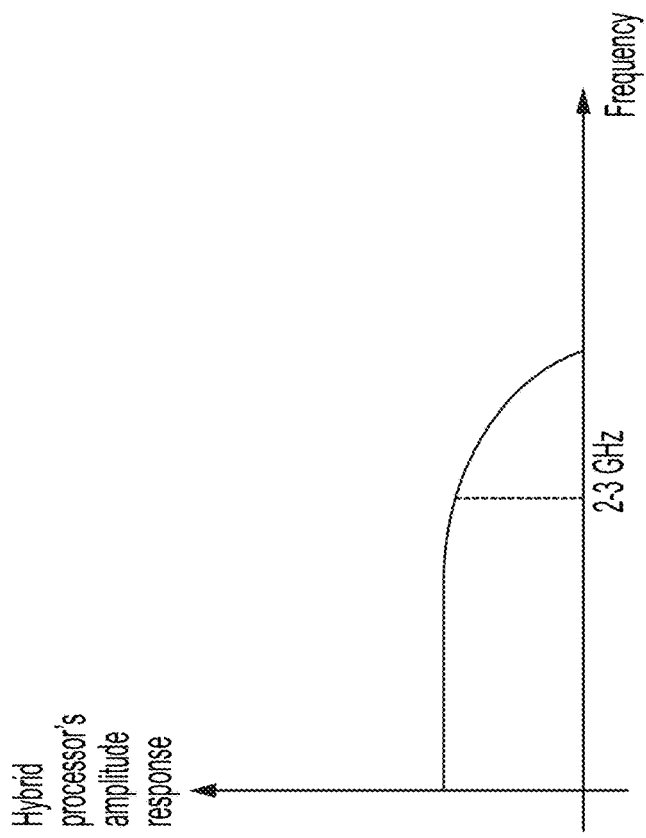
FIG. 3A is a plot illustrating a representative frequency response of a photonic accelerator, in accordance with some embodiments.

FIG. 3C is a plot illustrating the analog response of a hybrid processor and the digital data for a non-return-to-zero encoded output, as a function of time, in accordance with some embodiments. As shown in the figure, the analog response does not vary fast enough to be able to precisely replicate the level of the digital data, which can lead to errors.

The inventors have developed techniques that allow launching a new set of operands before the previous set of operands has settled to the final value. The techniques developed by the inventors involves determining the channel characteristics of the hybrid processor (e.g., the frequency response of a particular signal path of the hybrid processor)

and equalizing the channel characteristics to extend the bandwidth of the hybrid processor. Channel equalization allows the received signal to settle more quickly, thereby allowing for disambiguation of inter-calculation-interference. In some embodiments, channel equalization may be performed using digital filters. Several types of digital equalization techniques may be used, including but not limited to pre-emphasis, continuous time linear equalization (CTLE) and discrete feedback equalization (DFE). Processors leveraging the digital equalization techniques described herein may be fast enough to support clock frequencies in excess of 10 GHz, 15 GHz or even 20 GHz, which represents a substantial improvement over conventional processors.

Figure 4:
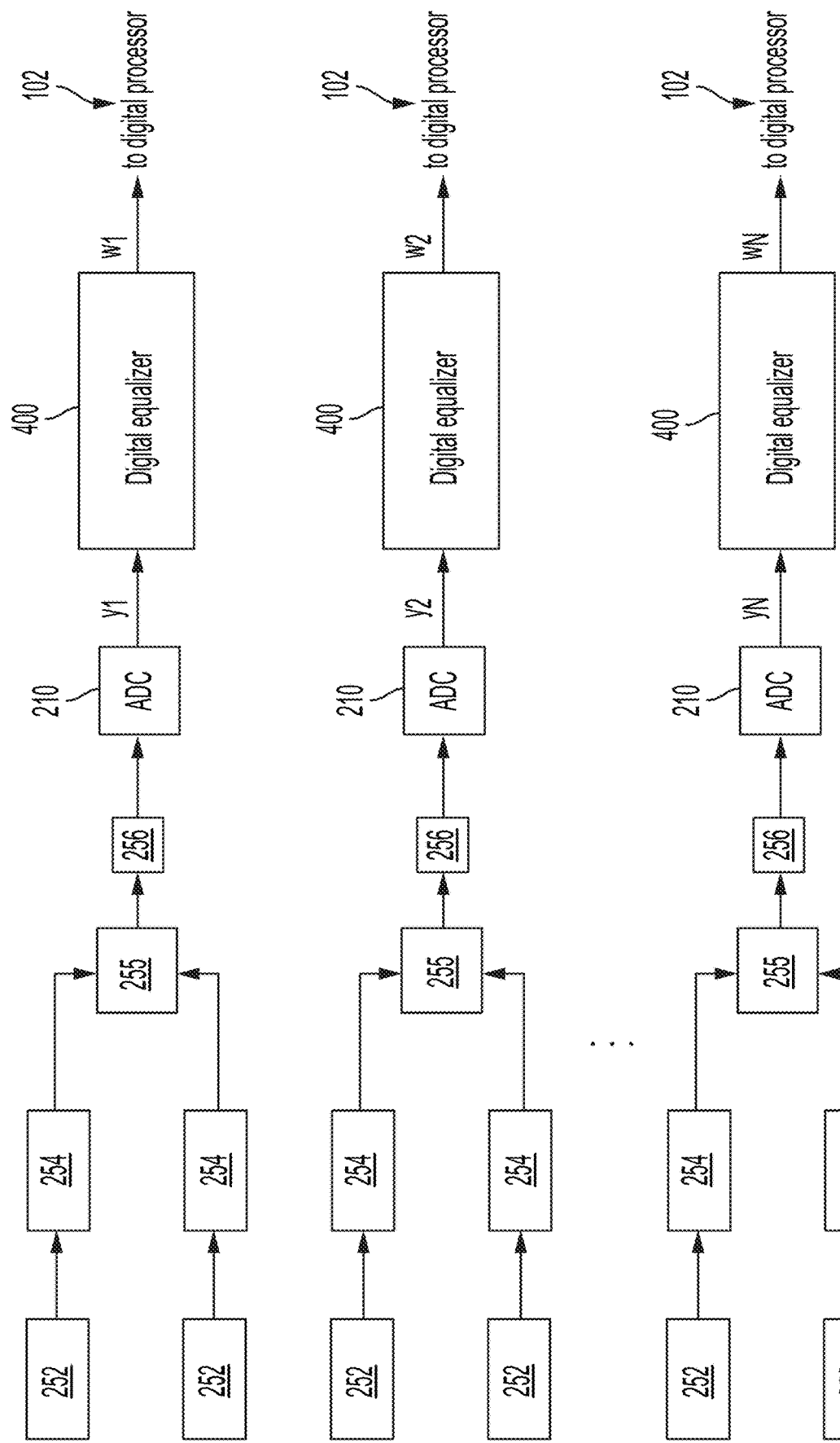
FIG. 4 is a block diagram illustrating a photonic accelerator including a plurality of digital equalizers, in accordance with some embodiments.

FIG. 4 is a block diagram of a portion of a photonic accelerator including a plurality of channels, in accordance with some embodiments. In this example, each channel is arranged in the manner discussed in connection with FIG. 2. Thus, each channel includes two or more optical encoders 252, two or more optical multipliers 254, an optical adder 255, an optical receiver 256 and an ADC 210. In some embodiments, a photonic accelerator may be designed to perform matrix-vector multiplication over very large matrices, for example in the order of 256×256, 512×512, or 1024×1024 (thought the matrix need not be square). In these example, a photonic accelerator may include 256, 512 or 1024 channels, one channel for each row of the matrix.

Figure 5A:
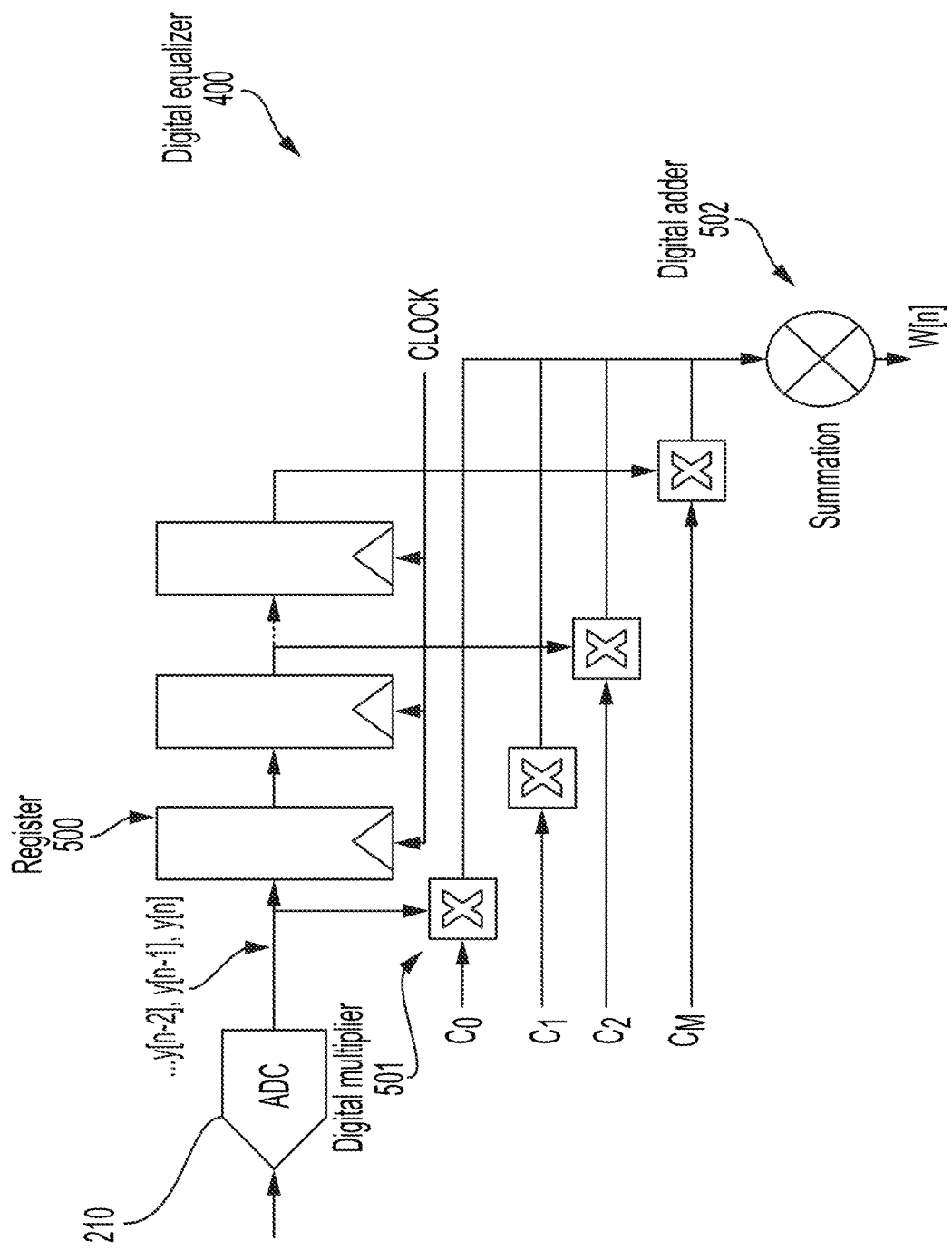
FIG. 5A is a block diagram illustrating a representative implementation of a digital equalizer, in accordance with some embodiments.

Each channel includes a digital equalizer 400 coupled to the output of the ADC. The inputs to the equalization channels are identified as y[n] (where n=1, 2 . . . N is the discretized time variable), and the outputs as w[n]. In some embodiments, an equalization channel 400 generates output w[n] by calculating a linear combination of the previous state samples y[n], y[n−1], y[n−2], etc. The linear combination can be expressed as follows:

$$w[n] = \sum_{i=0}^{M} c_i y[n-i]$$

where $c_i$ is a coefficient (whether real or complex) representing the channel response. Here, M determines how many previous state samples y[n] are used to implement the equalization. Where M is a finite number, digital equalizer 400 implements a finite impulse response (FIR) filter. In other embodiments, however, a digital equalizer 400 may implement an infinite impulse response (IIR) filter. Each state sample y[n−i] corresponds to a past (where i>0) or current (where i=0) digitization of the amplitude of the analog signal, and w[n] corresponds to the calculated steady-state output value for the current set of digital inputs. FIG. 5A is a block diagram illustrating a digital equalizer 400 that implements such a linear combination, in accordance with some embodiments. In this example, digital equalizer 400 includes a plurality of registers 500, a plurality of digital multipliers 501 and a digital adder 502. Each register 500 records the state sample (y) at a different time. For example, one register may record y[n−1], another register may record y[n−2], etc. The registers allow digital equalizer 400 to remember the historical state samples. Digital multipliers 501 multiply a state sample to a corresponding coefficient. One of the digital multipliers, for example, may multiply coefficient $c_1$ times state sample y[n−1]. Digital adder 502 adds the results of the digital multiplications to one another. As a result, output w[n] represents a linear combination of the historical state samples.

The coefficients $c_i$ may be determined in any of numerous ways based on the characteristics of the channel of the hybrid processor. In some embodiments, the coefficients $c_i$ may be obtained by exciting the hybrid processor with a known excitation, and by sampling the output at the desired rate. In some such embodiments, the coefficients can be calculated based on the following expression (though the last coefficient should be chosen so that the sum of all the coefficients equals 1):

$$c_i = \left(\frac{1}{y_1}\right)\left(1 - \sum_{m=1}^{i} c_{m-1} y_{2+i-m}\right)$$

Figure 5B:
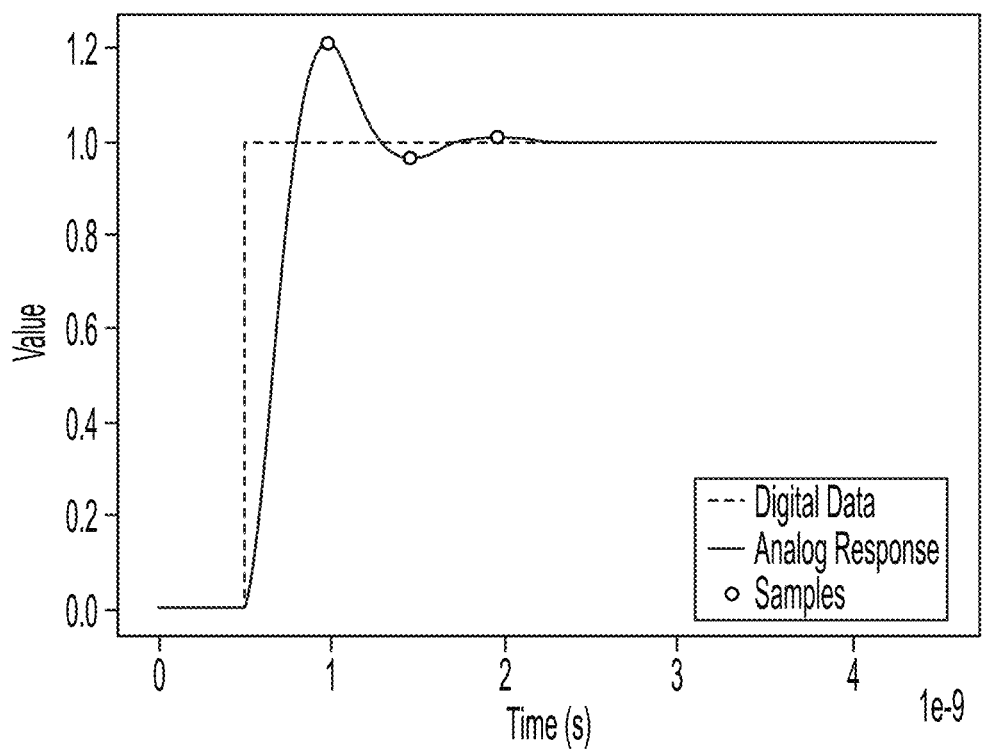
FIG. 5B is a plot illustrating a representative time-domain response of a digital equalizer, in accordance with some embodiments.

In some embodiments, the known excitation may be a step signal. FIG. 5B is a plot illustrating a step signal excitation (digital data) and the corresponding analog response. In this particular example, the digital equalizer records three samples, and based on those three samples, obtains the following $c_i$ coefficients: 0.834, 0.167 and −0.001.

Figure 5C:
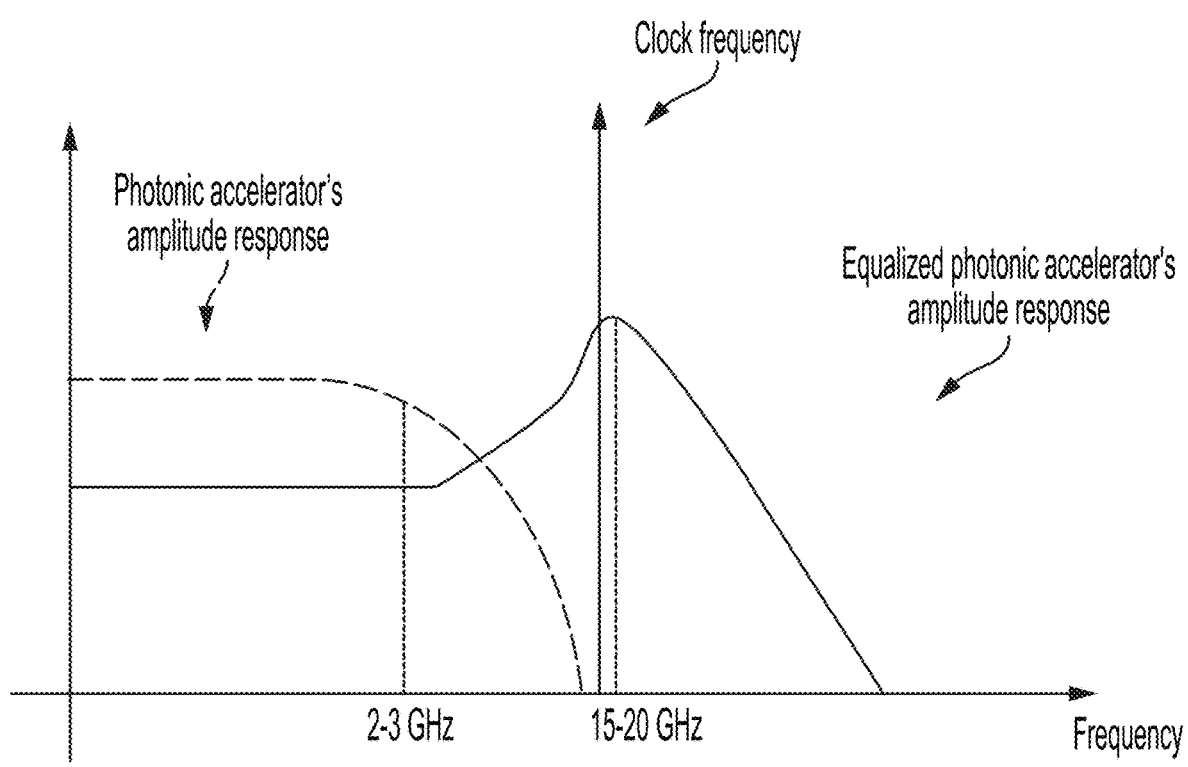
FIG. 5C is a plot illustrating a representative frequency response of a photonic accelerator with and without equalization, in accordance with some embodiments.

In some embodiments, a digital equalizer may suppress the low frequency components of the output signal and may amplify the higher frequency components. This results in a greater time-domain separation of the potentially interfering calculations and thus the ability to run calculations at a significantly higher rate. FIG. 5C is a plot illustrating the amplitude response of a photonic accelerator with and without equalization, in accordance with some embodiments. As shown in this figure, the response of the non-equalized photonic accelerator exhibits a bandwidth (e.g., 3 dB bandwidth) between 2 GHz and 3 GHz. The limited bandwidth may be due for example to the parasitic capacitance present in the circuitry controlling the photonic accelerator. The digital equalizer suppresses the low frequencies and amplifies the higher frequencies (in this example, with a peak between 15 GHz and 20 GHz). As a result, the equalized photonic accelerator exhibits a bandwidth that is larger that the bandwidth without equalization. For example, the bandwidth of the equalized photonic accelerator may be between 10 GHz and 30 GHz. Leveraging the bandwidth extension obtained thanks to the digital equalization, the hybrid processor may be timed using a clock having a frequency that is greater than the bandwidth of the non-equalized photonic accelerator while allowing for disambiguation of inter-calculation-interference. FIG. 5C further illustrates a clock having a frequency between the bandwidth of the non-equalized photonic accelerator and the bandwidth of the equalized photonic accelerator.

It should be appreciated that the equalization function that generates w[n] need not to be a linear function. In some embodiments. The equalization function can be nonlinear. In some embodiments, a digital equalizer may be designed to implement a discrete linear time-invariant system and to convert the transfer function to a linear constant-coefficient difference equation by means of z-transform. Consider the transfer function:

$$H(z) = W(z)/Y(z) = \sum_{k=0}^{M} z^{-k} b_k / \sum_{i=0}^{N} z^{-i} a_i$$

Using this transfer function, the equalizer can be represented by a difference equation (using the inverse z-transform):

$$y[n] = -\sum_{k=1}^{M} b_k y[n-k] + \sum_{i=0}^{N} a_i x[n-i]$$

where $a_i$ represents the feed-forward coefficients (for propagation from the input to the output) and $b_k$ represents the feed-backward coefficients (for propagation from the input to the output). The choice of the appropriate transfer function depends on the analog system the output values of which we to be predicted, and this transfer function can be measured by identifying the zeros and the poles of the system.

IV. Additional Comments

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The definitions, as defined and used herein, should be understood to control over dictionary definitions, definitions in documents incorporated by reference and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some case and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately," "substantially," and "about" may be used to mean within ±20% of a target value in some embodiments. The terms "approximately," "substantially," and "about" may include the target value.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another claim element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

What is claimed is:

1. A hybrid analog-digital processing system comprising:
an analog processor configured to perform matrix-vector multiplication, wherein the analog processor exhibits a frequency response having a first bandwidth;
a plurality of analog-to-digital converters (ADCs) coupled to the analog processor; and
a plurality of digital equalizers coupled to the plurality of ADCs, wherein the digital equalizers are configured to set a frequency response of the hybrid analog-digital processing system to a second bandwidth greater than the first bandwidth.

2. The hybrid analog-digital processing system of claim 1, further comprising clock circuitry configured to time the digital equalizers using a clock having a frequency between the first bandwidth and the second bandwidth.

3. The hybrid analog-digital processing system of claim 1, wherein at least one among the plurality of digital equalizers comprises a plurality of registers configured to store historical samples and to provide an output based at least in part on the historical samples.

4. The hybrid analog-digital processing system of claim 1, wherein the digital equalizers are configured to perform continuous time linear equalization (CTLE).

5. The hybrid analog-digital processing system of claim 1, wherein the digital equalizers comprise finite impulse response (FIR) filters, the FIR filters comprising respective pluralities of coefficients configured to equalize the frequency response of the analog processor.

6. The hybrid analog-digital processing system of claim 5, wherein the respective pluralities of coefficients are determined by passing one or more known inputs through the analog processor.

7. The hybrid analog-digital processing system of claim 6, wherein the known inputs include stepped inputs.

8. The hybrid analog-digital processing system of claim 1, wherein the analog processor comprises at least one electrical path having a length greater than 1 cm, and wherein the first bandwidth is less than 3 GHz.

9. The hybrid analog-digital processing system of claim 1, wherein the second bandwidth is between 10 GHz and 30 GHz.

10. The hybrid analog-digital processing system of claim 1, wherein the digital equalizers are configured to perform discrete feedback equalization (DFE).

11. The hybrid analog-digital processing system of claim 1, wherein the analog processor comprises a plurality of modulatable detectors, and wherein the analog processor is configured to perform matrix-vector multiplication using the plurality of modulatable detectors.

12. The hybrid analog-digital processing system of claim 1, wherein the analog processor comprises a plurality of optical adders, and wherein the analog processor is configured to perform matrix-vector multiplication using the plurality of optical adders.

13. A method for performing a mathematical operation using a hybrid analog-digital processing system comprising an analog processor, the method comprising:
- obtaining a plurality of parameters representing a first matrix;
- obtaining a first plurality of inputs representing a first input vector and obtaining a second plurality of inputs representing a second input vector;
- at a first time, generating a first output vector by performing matrix-vector multiplication using the analog processor based at least in part on the plurality of parameters and the first plurality of inputs;
- at a second time subsequent to the first time, generating a second output vector by performing matrix-vector multiplication using the analog processor based at least in part on the second plurality of inputs; and
- generating an equalized output vector by combining the first output vector with the second output vector.

14. The method of claim 13, wherein combining the first output vector with the second output vector comprises linearly combining the first output vector with the second output vector.

15. The method of claim 14, further comprising determining a plurality of coefficients by passing one or more known inputs through the analog processor, wherein linearly combining the first output vector with the second output vector comprises linearly combining the first output vector with the second output vector using the plurality of coefficients.

16. The method of claim 15, wherein passing one or more known inputs through the analog processor comprises passing one or more stepped inputs through the analog processor.

17. The method of claim 13, further comprising clocking the hybrid analog-digital processing system using a clock having a frequency greater than a bandwidth of the analog processor.

18. The method of claim 17, wherein the bandwidth is less than 3 GHZ, and the frequency of the clock is between 10 GHz and 30 GHz.

19. The method of claim 13, wherein combining the first output vector with the second output vector comprises performing continuous time linear equalization (CTLE).

20. The method of claim 13, wherein combining the first output vector with the second output vector comprises performing discrete feedback equalization (DFE).

21. The method of claim 13, wherein performing matrix-vector multiplication using the processor comprises performing matrix-vector multiplication using a plurality of modulatable detectors.

* * * * *